United States Patent
Lei et al.

(10) Patent No.: US 6,551,972 B1
(45) Date of Patent: Apr. 22, 2003

(54) SOLUTIONS FOR CLEANING SILICON SEMICONDUCTORS OR SILICON OXIDES

(75) Inventors: Tan-Fu Lei, Hsinchu (TW); Tien-Sheng Chao, Hsinchu (TW); Ming-Chi Liaw, Ping-Tung (TW)

(73) Assignee: Merck Patent Gesellschaft (DE)

( * ) Notice: Subject to any disclaimer, the term of this patent is extended or adjusted under 35 U.S.C. 154(b) by 0 days.

(21) Appl. No.: 09/462,464

(22) PCT Filed: Mar. 24, 1998

(86) PCT No.: PCT/EP98/01728
§ 371 (c)(1),
(2), (4) Date: Apr. 28, 2000

(87) PCT Pub. No.: WO99/03140
PCT Pub. Date: Jan. 21, 1999

(30) Foreign Application Priority Data

Jul. 10, 1997 (EP) .............................................. 9711688

(51) Int. Cl.$^7$ ............................. C11D 3/26; H01L 21/00
(52) U.S. Cl. ...................... 510/175; 510/176; 510/177; 510/178; 134/1.3; 438/692
(58) Field of Search ................................ 510/175, 176, 510/477, 434, 504, 501, 177, 178; 134/1.3, 2, 3, 902, 40, 36; 438/217, 690, 692

(56) References Cited

U.S. PATENT DOCUMENTS

| | | | |
|---|---|---|---|
| 4,113,551 A | 9/1978 | Bassous et al. | ............. 156/662 |
| 4,171,242 A | 10/1979 | Liu | ............................ 156/657 |
| 5,290,361 A | * 3/1994 | Hayashida et al. | ............ 134/2 |
| 5,466,389 A | * 11/1995 | Illardi et al. | ................. 252/156 |
| 5,489,557 A | * 2/1996 | Jolley | ...................... 156/640.1 |

FOREIGN PATENT DOCUMENTS

| | | |
|---|---|---|
| EP | 561236 | 9/1993 |
| EP | 649168 | 4/1995 |
| EP | 665582 | 8/1995 |
| FR | 2722511 | 1/1996 |

* cited by examiner

Primary Examiner—Gregory E. Webb
(74) Attorney, Agent, or Firm—Millen, White, Zelano & Branigan, P.C.

(57) ABSTRACT

A solution for cleaning silicon semiconductors or silicon oxides comprising $H_2O_2$, $NH_4OH$ and at least one component A selected from the group consisting of fluoro-containing compounds and other ammonium salts than $NH_4OH$, wherein the weight ratio of $H_2O_2$ to $H_2O$ is between 1:5 and 1:50, the weight ratio of $NH_4OH$ to $H_2O$ is between 1:5 and 1:50, and the molar ratio of component A to $NH_4OH$ is between 1:10 and 1:5000 is disclosed. The solution can achieve the efficacy equivalent to that of the conventional RCA two-step cleaning solution within a shorter time by one step and effectively remove contaminants such as organics, dust and metals from the surfaces of silicon semiconductors and silicon oxides without using strong acids such as HCl and $H_2SO_4$.

6 Claims, 6 Drawing Sheets

SOLUTIONS FOR CLEANING SILICON SEMICONDUCTORS OR SILICON OXIDES

FIELD OF THE INVENTION

The present invention pertains to solutions for cleaning silicon semiconductors or silicon oxides. More specifically, the present invention provides solutions which can remove contaminants such as organics, dust and metals from the surfaces of silicon semiconductors and silicon oxides by one step.

BACKGROUND OF THE INVENTION

Persons in the art continuously engage in modifying the course of production of silicon semiconductor elements and micro-circuits to meet the efficacy and reliability requirements and to provide more reliable processing technology. In the course of production of semiconductor elements, semiconductor wafers and glass wafers are first produced, cleaning steps are conducted thereafter, and then optional operations are conducted. Generally, the modifications of the course of production of semiconductor elements are directed to the cleaning steps. It is believed that the elimination or reduction of contamination on the surfaces of wafers can significantly improve the stability and reliability of elements.

In 1970, RCA (Radio Corporation of America) developed an effective cleaning system for removing contaminants from surfaces of silicon semiconductors and silicon oxides. The system comprises two cleaning steps. An aqueous solution comprising $H_2O_2$ and $NH_4OH$ is used in the first step to remove organic is used in the first step to remove organic contaminants. Since the solution may inevitably cause contamination with heavy metals such as Fe, Zn and Al which are trace metal contaminants in the solution, a solution containing HCl must be used in the second step to remove the metal contaminants. According to the RCA system, an effective cleaning operation comprises using a solution comprising 5:1:1 to 7:2:1 by volume of $H_2O$/ 30%$H_2O_2$/27%$NH_4OH$ in the first step for 10 to 20 minutes and using a solution comprising 6:1:1 to 8:2:1 by volume of $H_2O$/30%$H_2O_2$/37%HCl in the second step for 10 to 20 minutes. In other words, RCA system must use strong acid chemicals such HCl, involves two steps and needs at least 20 minutes for cleaning.

Though RCA system can effectively remove heavy metal contaminants from the surfaces of wafers, particles contained in the acidic cleaning solution which comprises HCl will stick to and contaminate the surfaces. Further, RCA system involves two separate steps and this is an inconvenient operation. Persons in semiconductor device and silicon wafer industries continuously search for new formulations to replace RCA system to provide an easier, more effective and more economical cleaning system.

Various approaches have been developed to replace the RCA system and most of them are directed to the cleaning solution of the second step. Japanese Patent KOKAI (Laid-Open) No. Sho 58-30135 discloses the use of an acidic aqueous solution containing HF, $H_2SO_4$ and $H_2O_2$. Japanese Patent KOKAI (Laid-Open) No. Hei 2-100320 discloses the use of a combination of a mixture of $NH_4$ and $H_2O_2$ in water and a mixture of HCl and $H_2O_2$ in water. A solution of strong acid and a very small amount of a compound containing fluorine is disclosed in Japanese Patent KOKAI (Laid-Open) No. Hei 4-234118. A solution containing 0.50% HF and 0.1 to 1% $H_2O_2$ is disclosed in "TRYBOROZIST" Vol. 37, No. 3, (1992) pp. 218–224 and the cleaning is conducted at room temperature. U.S. Pat. No. 5,560,857 discloses the use of an aqueous acidic solution containing 0.005% to 0.05% by weight HF and 0.3% to 20.0% by weight $H_2O_2$ and having a pH in the range from 1 to 5. In other words, most modifications on RCA system are directed to the substitution of the solution used in the second cleaning step.

However, as mentioned above, in addition to the shortcoming of particle contamination, RCA system further has the disadvantages of an inconvenient operation (involving two steps and requiring at least 20 minutes) and the use of strong acid chemicals. All the aforementioned known approaches cannot avoid these disadvantages. There is a necessity in the art of an effective cleaning system to simplify the RCA system, avoid the use of strong acid chemicals and meet the simple, effective and economical requirements.

SUMMARY OF THE INVENTION

It is an object of the present invention to provide a new cleaning solution which can significantly reduce the cleaning time, simplify the cleaning procedures and avoid the use of strong acid chemicals. Specifically, the present invention provides a solution comprising $NH_4OH$, $H_2O_2$ and at least one component A selected from the group consisting of fluoro-containing compounds and other ammonium salts than $NH_4OH$. The solution of the present invention can replace the solutions used in the first and second steps of RCA system and can provide the efficacy of RCA cleaning system by one step.

It is another object of the present invention to provide integrated circuit elements with good electricity appearance and their charge to breakdown and breakdown field are superior to those cleaned by RCA system.

BRIEF DESCRIPTION OF THE DRAWINGS

1, and ☐ represents the capacitors prepared by use of the cleaning solution of the present invention with NH₄OH/NH₄F=30/1.

DETAILED DESCRIPTION OF THE INVENTION

The present invention provides solutions which can provide the cleaning efficacy equivalent to that provided by RCA system by one step and can be used for cleaning the surfaces of silicon semiconductors and silicon oxides. Specifically, the present invention provide solutions for removing contaminants such as organics, dust and metals from the surfaces of silicon semiconductors and silicon oxides. The solutions of the present invention comprise H₂O₂, NH₄OH and at least one component A selected from the group consisting of fluoro-containing compounds and other ammonium salts than NH₄OH.

The cleaning solution of the present invention comprises specific amounts of H₂O₂, NH₄OH and at least one component A, wherein the weight ratio of H₂O₂ to H₂O is between 1:5 and 1:50, preferred between 1:10 and 1:30 and most preferred between 1:15 and 1:25; the weight ratio of NH₄OH to H₂O is between 1:5 and 1:50; preferred between 1:10 and 1:30 and most preferred between 1:15 and 1:25; and the molar ratio of component A to NH₄OH is between 1:10 and 1:5000, preferred between 1:10 and 1:1000, most preferred between 1:50 and 1:500, especially between 1:100 and 1:500.

Fluoro-containing compounds suitable for use as component A of the present invention are those capable of providing F⁻ in solution. Preferably, the fluoro-containing compound is selected from the group consisting of NH₄F and non-metallic fluorides. Ammonium salts for use as component A of the present invention are those capable of providing other ammonium cations than NH₄⁺. It is preferred that the ammonium salt has the following formula (I)

wherein R₁, R₂, R₃ and R₄ independently are H or C₁₋₈ alkyl, preferably are C₁₋₄ alkyl, most preferably are methyl with the proviso that at least one of R₁–R₄ is not H.

The cleaning solution of the present invention can replace the two-step RCA system and can provide the efficacy of RCA system within a shorter time by one step and effectively remove the contaminants such as organics, dust and metals from surfaces of silicon semiconductors and silicon oxides. In one embodiment of the present invention, the cleaning solution of the present invention is used prior to the formation of gate oxide on surfaces of silicon semiconductors or silicon oxides to remove contaminants including organics, dust and metals from the surfaces. The cleaning solution of the present invention can achieve cleaning efficacy by one step and within a time shorter than that of two-step RCA system without using strong acids such as HCl and H₂SO₄ and thus can meet the simple and economical requirements of the art.

Figure 1:
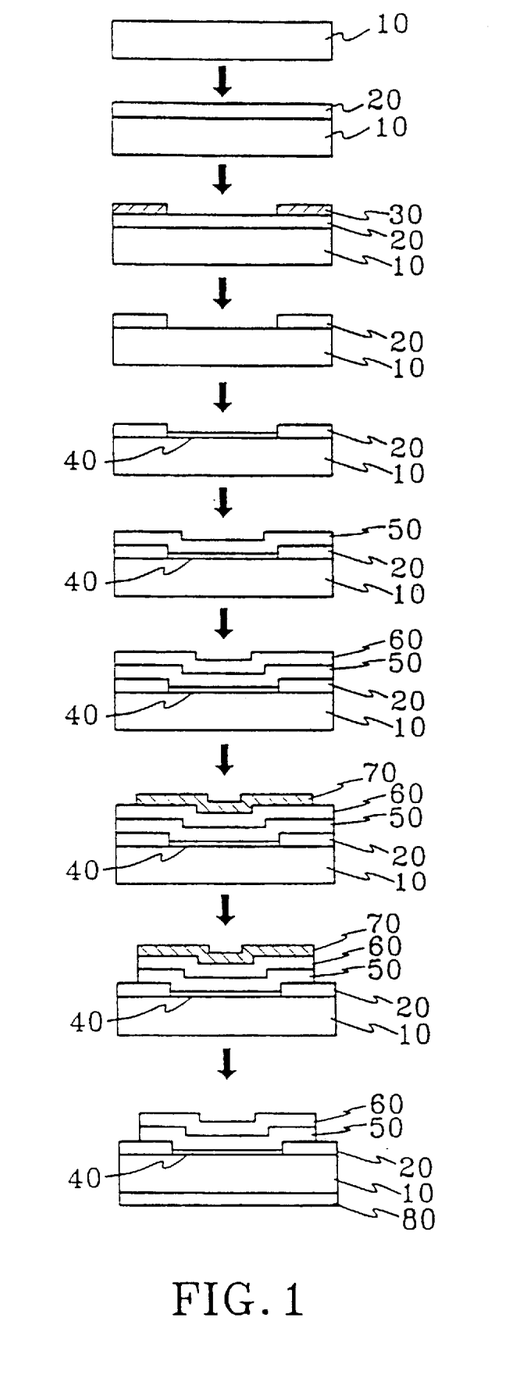
FIG. 1 shows a conventional procedure for preparing capacitor elements of integrated circuit, wherein:
10 represents a chip;
20 represents an oxide layer;
30 represents a photoresist layer;
40 represents a gate oxide layer;
50 represents a polysilicon layer;
60 represents an aluminum layer;
70 represents a photoresist layer; and
80 represents an aluminum layer.

FIG. 1 shows a conventional procedure for preparing capacitor elements of integrated circuit. Chip 10 is cleaned by use of a cleaning solution and oxide layer 20 is formed above chip 10 by wet oxidation. A photoresist layer is then formed above layer 20 and a mask is used to expose the desired region so as to obtain photoresist layer 30. Thereafter, the uncovered oxide region is removed by an etching agent and photoresist layer 30 is removed. Chip 10 which is covered by oxide layer 20 is cleaned by a cleaning solution and then gate oxide layer 40 is formed by dry oxidation. Polysilicon layer 50 is formed on chip 10 and optional dopants can be used to dope polysilicon layer 50 into the desired type. Aluminum layer 60 is formed on polysilicon layer 50. A photoresist layer is formed on aluminum layer 60 and a mask is used to expose the desired region so as to obtain photoresist layer 70. An etching agent is used to remove the regions of aluminum and polysilicon layers uncovered by photoresist layer and any possible oxides formed on the back side of chip 10. Aluminum layer 80 is formed on the back side of chip 10 and photoresist layer 70 is moved. Chip 10 is put in an annealing furnace for annealing to obtain the desired integrated circuit element.

The following examples are offered by way of illustration. The examples are not intended to be limit the scope of the invention in any respect and should not be so construed.

EXAMPLES

Example 1

According to the procedure of FIG. 1, a chip was first cleaned by conventional RCA system and then the chip was put into a high temperature furnace at 1050° C. for 1 hour to form thereon a silicon oxide layer with a thickness of 5500 Å. A photoresist layer was formed on the oxide layer and a mask was used to exposed the desired region. B.O.E etching agent (a buffering oxide etching agent solution wherein the ratio of NH₄F to HF is 6:1) available from E-Merk Chemical Technology Corporation, Taiwan, R.O.C. was used to remove the oxide region uncovered by photoresist layer. Thereafter, the chip was put into a solution comprising 3 parts by volume 98 wt % H₂SO₄ and 1 part by volume 31 wt % H₂O₂ at 120° C. for 10 minutes to remove the residuary photoresist. About one gallon of cleaning solution comprising NH₄OH, TMAH and H₂O₂ was used to clean the chip at 75° C. for 10 minutes, wherein the solution was prepared by mixing a 31 wt % H₂O₂ aqueous solution, a 29 wt %, NH₄OH aqueous solution, a 25 wt % TMAH aqueous solution and deionized water and the mixed volume of (29%NH₄OH+25% TMAH):31%H₂O₂:H₂O was 1:1:5 and the molar ratio of NH₄OH to TMAH was 100:1. The cleaned chip was delivered to a high temperature furnace at 900° C. for 10 minutes to form thereon a gate silicon oxide layer with a thickness of 70 Å. The chip was then delivered to a low pressure chemical vapor deposition system at 620° C. to form a polysilicon layer with a thickness of 3000 Å on the chip. The polysilicon layer was doped with $POCl_3$ at 950° C. for 25 minutes into n-type. The residuary oxide layer on the surface of chip was removed by B.O.E. etching agent. An aluminum layer with a thickness of 5000 Å was formed on the polysilicon layer by evaporating aluminum in a low pressure instrument. The evaporation of aluminum was conducted by use of resistance coil and according to conventional methods. A photoresist layer was formed on the aluminum layer and a mask was used to expose the desired region. A solution comprising $CH_3COOH:HNO_3:H_3PO_4$= 5:5:85:5 was used to etch aluminum and polysilicon layers and B.O.E. etching agent was used to remove any possible oxides formed on the back side of chip. In addition, an aluminum layer with a thickness of 5000 Å was formed on the back side of chip for use as the back side contact for measurement. Thereafter, the residuary photoresist was removed. Finally, the chip was sent to an annealing furnace at 400° C. for 30 minutes to obtain a better contact between aluminum and silicon and to provide capacitor sample group I.

Example 2

Repeating the procedure of Example 1 with the exception that the molar ratio of $NH_4OH$ to TMAH in the cleaning solution was adjusted to 300:1 and 500:1 to respectively provide capacitor sample groups II and III.

Comparative Example C-1

Repeating the procedure of Example 1 with the exception that RCA cleaning system was used prior to the formation of gate oxide layer. The amount of cleaning solution used in the first and second cleaning steps was about one gallon respectively and each step was carried out at 75° C. for 10 minutes. The volume ratio of 29%$NH_4OH$:31% $H_2O_2$:$H_2O$ in the cleaning solution of the first step was 1:1:5 and the volume ratio of 37% HCl:31% $H_2O_2$:$H_2O$ in the cleaning solution of the second step was 1:1:6. Therefore, control capacitor sample group V was obtained.

Assesssment of Cleaning Efficacy

Figure 2:
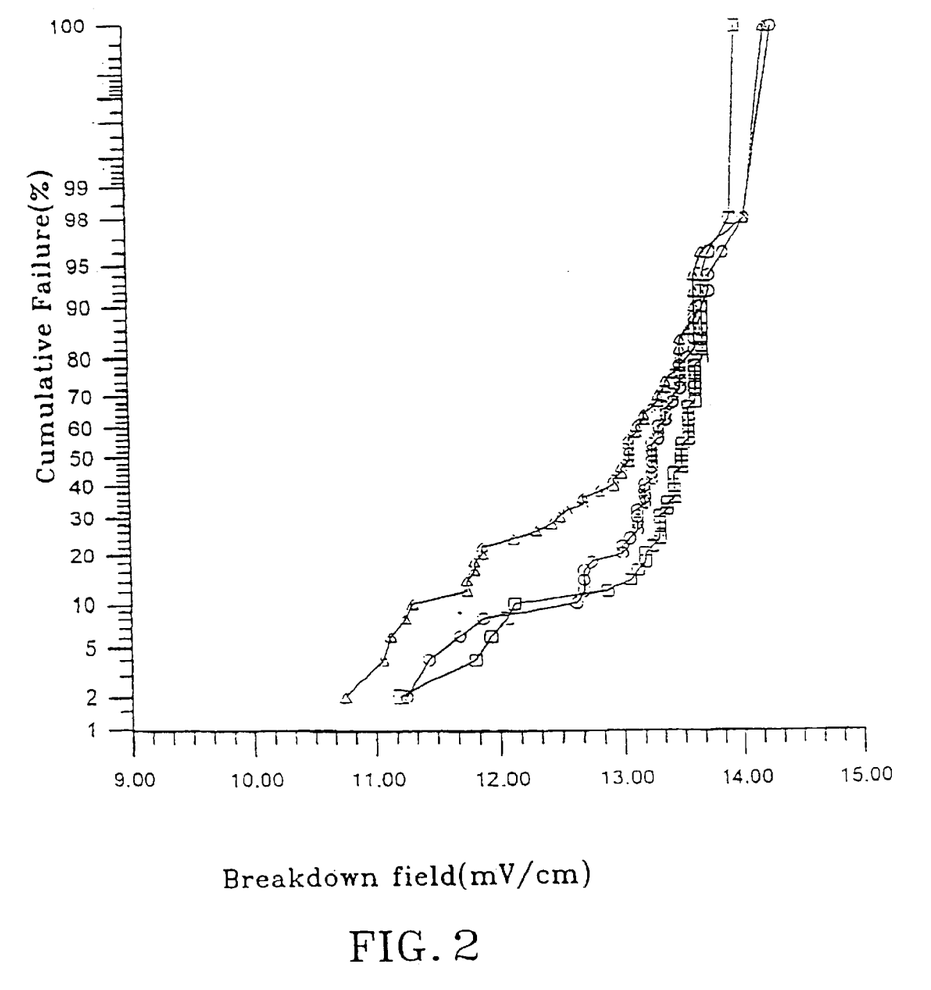
FIG. 2 shows the distribution of breakdown field of capacitors prepared by use of the cleaning solution of the present invention with different proportions of $NH_4OH$/ TMAH, wherein ▲ represents $NH_4OH$/TMAH=100/1, ⊖ represents $NH_4OH$/TMAH=300/1, and ⊟ represents $NH_4OH$/TMAH =500/1.
Figure 3:
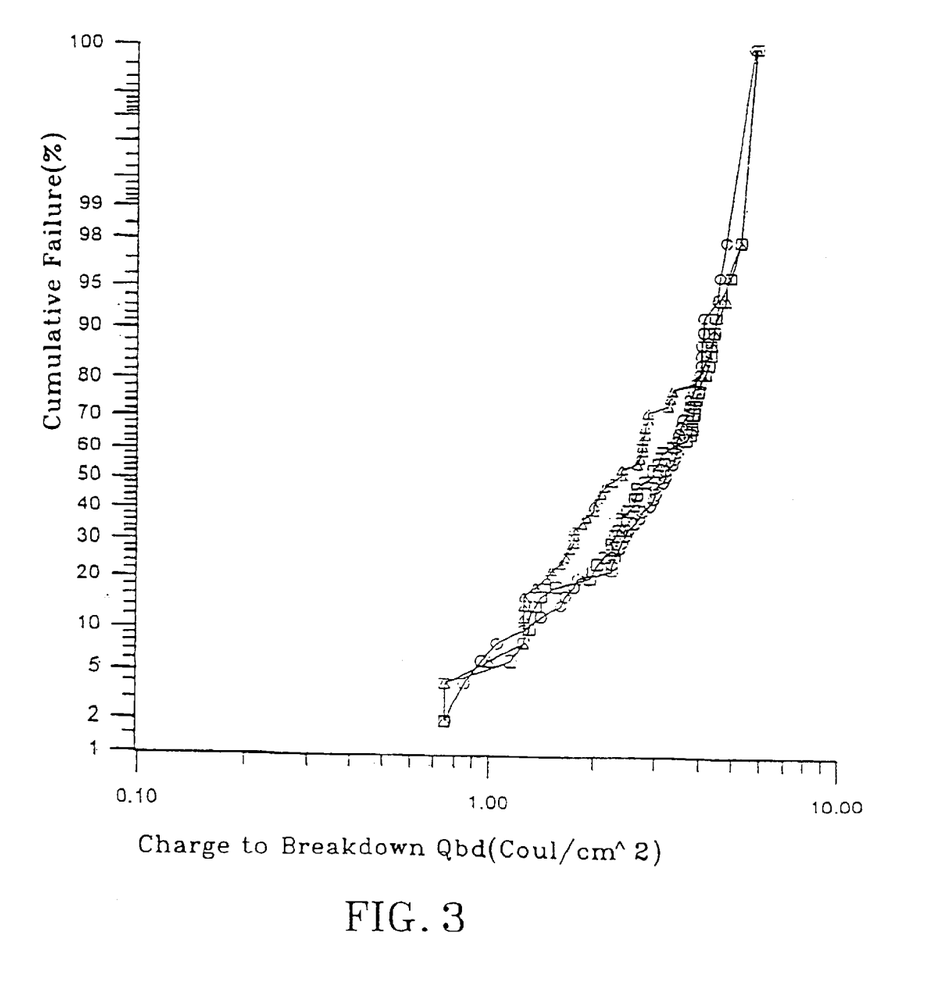
FIG. 3 shows the distribution of charge to breakdown of capacitors prepared by use of the cleaning solution of the present invention with different proportions of $NH_4OH$/ TMAH, wherein ▲ represents $NH_4OH$/TMAH=100/1, ⊖ represents $NH_4OH$/TMAH=300/1, and ⊟ represents NHdOH/TMAH=500/1.
Figure 4:
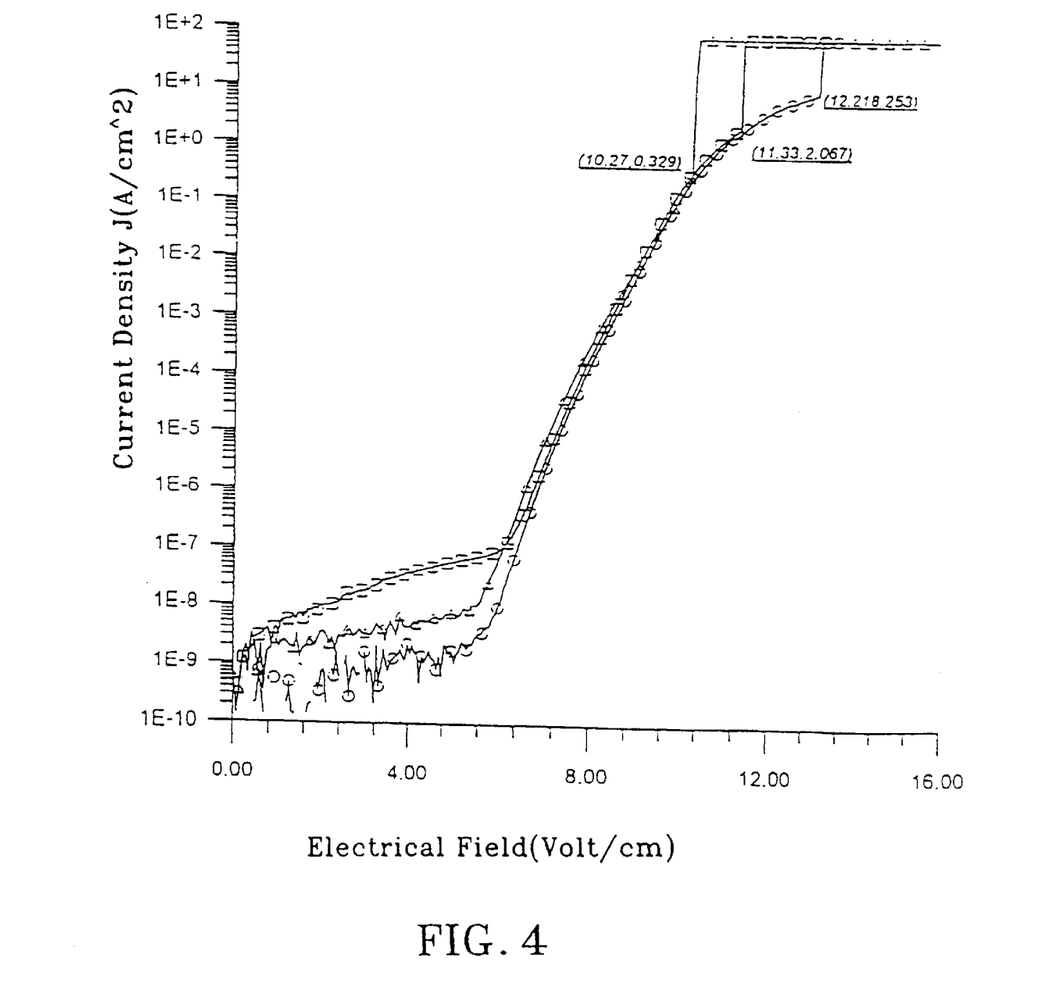
FIG. 4 shows a plot of current density versus electrical field of capacitors prepared by use of RCA system and those prepared by use of two formulations of the one-step cleaning solution of the present invention, wherein ▲ represents the control capacitors prepared by use of RCA system, ⊖ represents the capacitors prepared by use of the cleaning solution of the present invention with $NH_4OH$/TMAH=100/
Figure 5:
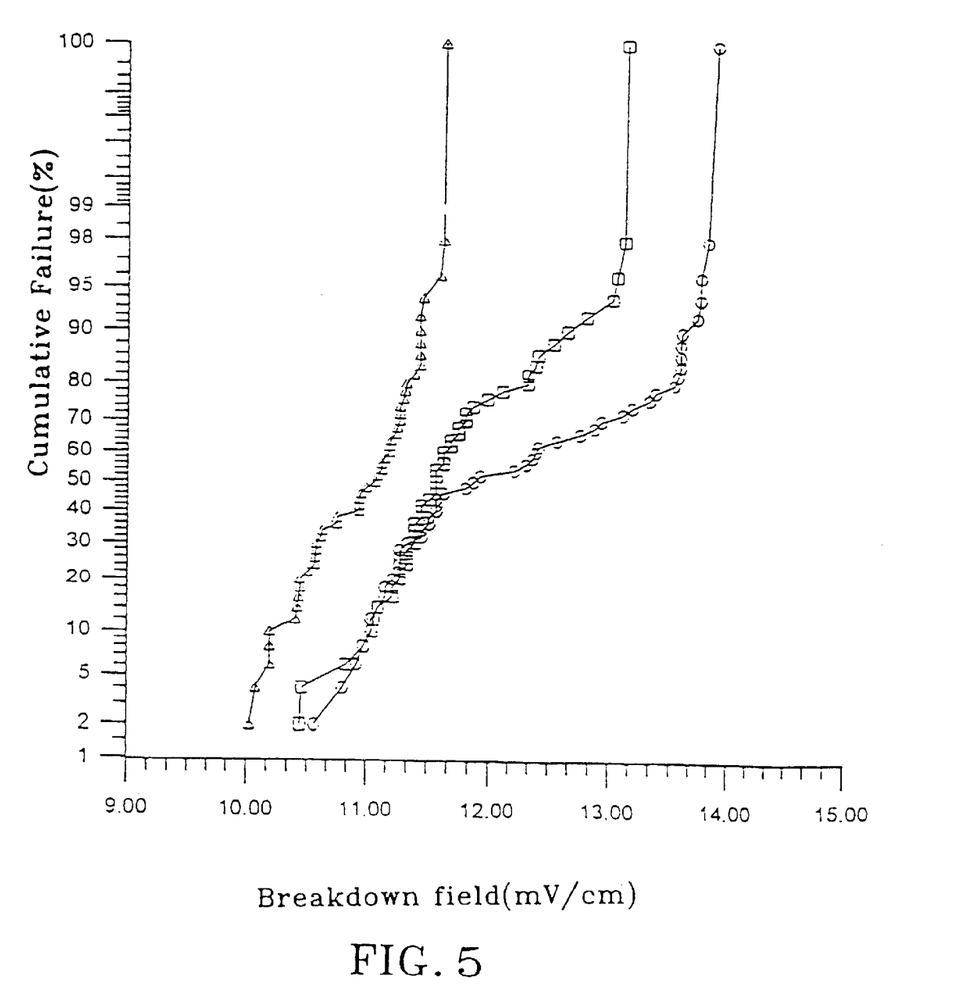
FIG. 5 shows the distributions of breakdown field of capacitors prepared by use of RCA system and those prepared by use of two formulations of the one-step cleaning solution of the present invention, wherein ▲ represents the control capacitors prepared by use of RCA cleaning system, ⊖ represents the capacitors prepared by use of the cleaning solution of the present invention with NH₄OH/TMAH=100/1, and ☐ represents the capacitors prepared by use of the cleaning solution of the present invention with NH₄OH/NH₄F=30/1.
Figure 6:
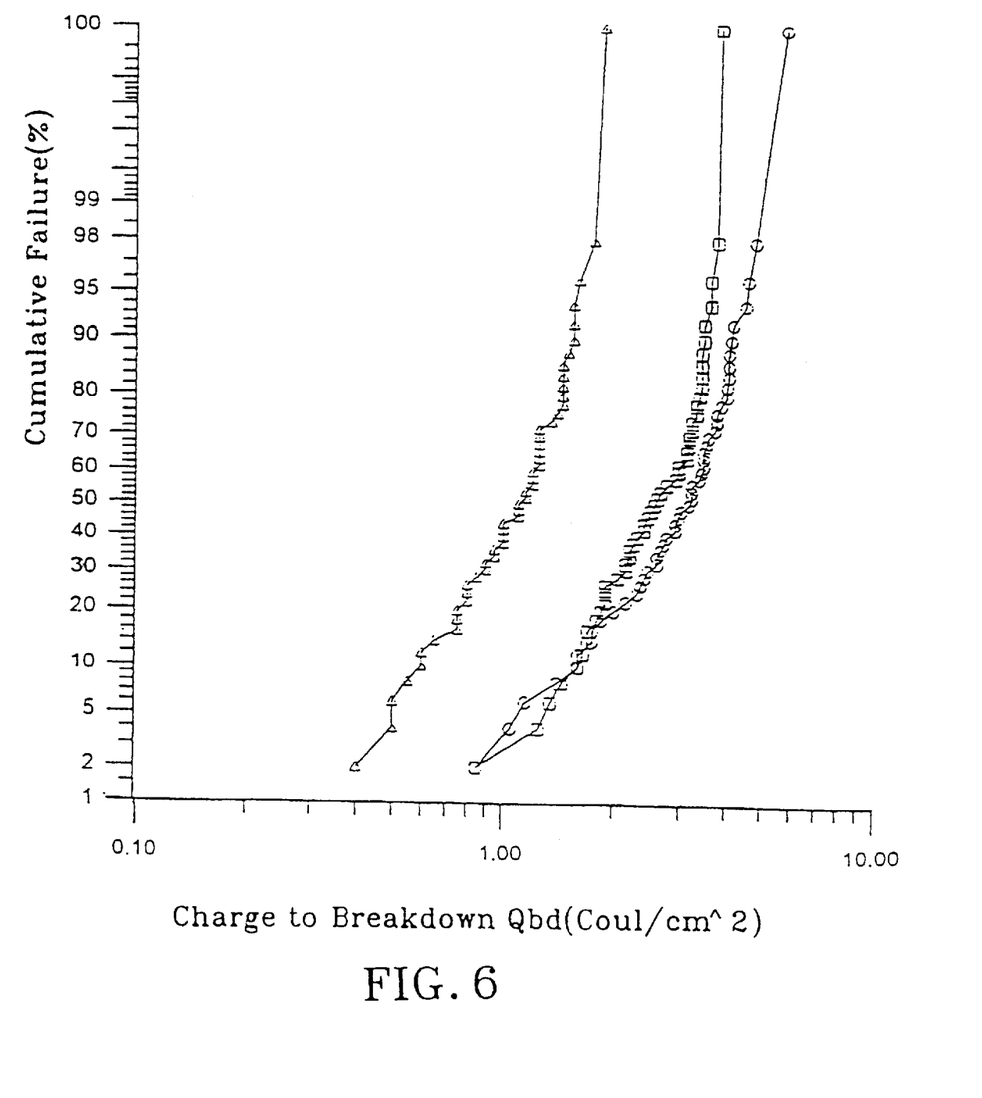
FIG. 6 shows the distributions of charge to breakdown of capacitors prepared by use of RCA cleansing system and those prepared by use of two formulations of the one-step cleaning solution of the present invention, wherein ▲ represents the control capacitors prepared by use of RCA system, ⊖ represents the capacitors prepared by use of the cleaning solution of the present invention with NH₄OH/TMAH=100/1, and ☐ represents the capacitors prepared by use of the cleaning Solution of the present invention with NH₄OH/NH₄F=30/1.

The electrical properties of sample groups I–IV (the area of each sample was $1.86 \times 10^{-4}$ $cm^2$) were tested and the results were shown in FIGS. 2–6. FIGS. 2 and 3 show the statical distributions of charge to breakdown and breakdown field of sample groups I–III. FIGS. 4–6 respectively show the plot of current density versus electrical field, the statical distribution of charge to breakdown and the statical distribution of breakdown field of sample groups I, IV and V. The charge to breakdown and breakdown field were tested at a current density of 50 $mA/cm^2$. FIGS. 2–4 show that the cleaning solution of the present invention can provide samples with better electrical properties than those provided by RC. system, i.e. can provide better cleaning efficacy, when the molar ratio of component A to $NH_4OH$ is 1:100 or lower. Though the samples obtained by use of the cleaning solution of the present invention having a molar ratio of component A to $NH_4OH$ up to 1/30 have a larger leakage current at small electrical field, their electrical properties are superior to those of the samples obtained from RCA cleaning system. In other words, the cleaning solution of the present invention can avoid the shortcomings of RCA cleaning system and can provide cleaning efficacy equivalent to or better than that provided by RCA cleaning system within shorter time and by use of less amount of cleaning solution. The cleaning solution of the present invention indeed can meet the simple and economical requirements of the art.

What is claimed is:

1. A solution for cleaning surfaces of silicon semiconductors or silicon oxides comprising $H_2O_2$, $NH_4OH$ and at least one component A selected from the group consisting of fluoro-containing compounds selected from the group consisting of $NH_4F$ and non-metallic fluoride and $N(CH_3)_4OH$, wherein the weight ratio of $H_2O_2$ to $H_2O$ is between 1:5 and 1:50, the weight ratio of $NH_4OH$ to $H_2O$ is between 1:5 and 1:50 and the molar ratio of component A to $NH_4OH$ is between 1:10 and 1:5000.

2. The solution of claim 1, wherein the molar ratio of component A to $NH_4OH$ is between 1:10 and 1:1000.

3. The solution of claim 2, wherein the molar ratio of component A to $NH_4OH$ is between 1:100 and 1:500.

4. The solution of claim 1, wherein the weight ratio of $NH_4OH$ to $H_2O$ is between 1:10 and 1:30.

5. The solution of claim 1, wherein the weight ratio of $H_2O_2$ to $H_2O$ is between 1:10 and 1:30.

6. A method for cleaning surfaces of silicon semiconductors or silicon oxides in a single step comprising applying to a solution according to claim 1.

* * * * *

UNITED STATES PATENT AND TRADEMARK OFFICE
CERTIFICATE OF CORRECTION

PATENT NO. : 6,551,972 B1
DATED : April 22, 2003
INVENTOR(S) : Lei et al.

It is certified that error appears in the above-identified patent and that said Letters Patent is hereby corrected as shown below:

<u>Title page,</u>
Item [73], Assignee, after "Merck Patent" delete "Gesellschaft" and insert thereafter -- GmbH, Darmstadt --
Item [30], Foreign Application Priority Data, "9711688" should read -- 97111688 --

<u>Column 6,</u>
Line 30, "fluoride" should read -- fluorides --

Signed and Sealed this

Sixth Day of July, 2004

JON W. DUDAS
*Acting Director of the United States Patent and Trademark Office*